(12) United States Patent
Voiron et al.

(10) Patent No.: US 12,347,790 B2
(45) Date of Patent: Jul. 1, 2025

(54) SEMICONDUCTOR STRUCTURE WITH CRACK-BLOCKING THREE-DIMENSIONAL STRUCTURE

(71) Applicant: Murata Manufacturing Co., Ltd., Nagaokakyo (JP)

(72) Inventors: Frédéric Voiron, Barraux (FR); Larry Buffle, Grenoble (FR)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 413 days.

(21) Appl. No.: 17/820,353

(22) Filed: Aug. 17, 2022

(65) Prior Publication Data
US 2022/0392852 A1    Dec. 8, 2022

Related U.S. Application Data

(63) Continuation of application No. PCT/IB2021/051172, filed on Feb. 12, 2021.

(30) Foreign Application Priority Data

Feb. 17, 2020   (EP) .................................. 20305144

(51) Int. Cl.
*H01L 23/00*   (2006.01)
*H01L 23/544*  (2006.01)

(52) U.S. Cl.
CPC .......... *H01L 23/562* (2013.01); *H01L 23/544* (2013.01); *H01L 2223/5446* (2013.01)

(58) Field of Classification Search
CPC ................ H01L 23/562; H01L 23/544; H01L 2223/5446; H01L 23/585; H01L 28/90
See application file for complete search history.

(56) References Cited

U.S. PATENT DOCUMENTS

| | | | |
|---|---|---|---|
| 2009/0160020 A1 | 6/2009 | Barth et al. | |
| 2015/0340346 A1* | 11/2015 | Chu | H01L 33/50 257/89 |
| 2015/0371956 A1† | 12/2015 | Argarwal | |
| 2017/0256638 A1 | 9/2017 | Macelwee et al. | |
| 2018/0247869 A1* | 8/2018 | Zechmann | H01L 29/0649 |
| 2019/0074349 A1 | 3/2019 | Lin et al. | |
| 2019/0115302 A1 | 4/2019 | Blank et al. | |
| 2020/0006224 A1* | 1/2020 | Wang | H01L 21/76802 |
| 2021/0091174 A1 | 3/2021 | Voiron et al. | |

(Continued)

OTHER PUBLICATIONS

International Search Report issued for PCT/IB2021/051172, date of mailing Apr. 23, 2021.

(Continued)

*Primary Examiner* — Jeff W Natalini
*Assistant Examiner* — Rose Keagy
(74) *Attorney, Agent, or Firm* — ArentFox Schiff LLP (57) ABSTRACT

A semi-conductor structure with a crack-blocking three-dimensional structure is described. The semiconductor structure includes a substrate; a functional circuit structure disposed in an area of the substrate; and a three-dimensional structure having at least one continuous trench that extends perpendicularly towards a base surface of the substrate and that surrounds the area of the substrate containing the functional circuit structure.

10 Claims, 7 Drawing Sheets

(56) References Cited

U.S. PATENT DOCUMENTS

2022/0393038 A1* 12/2022 Buffle .................. H01L 28/90

OTHER PUBLICATIONS

Gruenler, S. et al.; "High-Voltage Monolithic 3D Capacitors based on Through-Silicon-Via Technology"; IEEE International Interconnect Technology Conference and IEEE Materials for Advanced Metallization Conference, May 18-21, 2015, Grenoble.
Kevin Luke et al, Overcoming Si3N4 film stress limitations for high quality factor ring resonators, 5 pages, Sep. 20, 2013, Optics Express, US.†

\* cited by examiner
† cited by third party

SEMICONDUCTOR STRUCTURE WITH CRACK-BLOCKING THREE-DIMENSIONAL STRUCTURE

CROSS REFERENCE TO RELATED APPLICATIONS

The present application is a continuation of International application No. PCT/IB2021/051172, filed Feb. 12, 2021, which claims priority to European Patent Application No. 20305144.6, filed Feb. 17, 2020, the entire contents of each of which are incorporated herein by reference.

FIELD OF THE INVENTION

The present invention relates to the field of integration and, more particularly, to electronic products, related semiconductor products, and their methods of manufacture.

BACKGROUND OF THE INVENTION

Increasing capacitance density is a key objective in the development of emerging capacitive components. In the case of silicon-integrated capacitors, one approach to boost capacitance density includes increasing the specific surface of the capacitive structure by 3D-structuring the surface of the silicon wafer. This allows a reduction of die surface and brings silicon-integrated capacitive technology to a level of integration that matches implementation requirements of low-voltage applications.

However, in the emerging field of high voltage applications (steered by the roadmap of integrated power technology like GaN (gallium nitride) and SiC (silicon carbide)), capacitive technology integration remains largely unstudied. In such applications, to prevent early fails and/or premature wear out of the capacitive device, the operating electric field must be guaranteed with a sufficient margin for the desired lifetime of the device. One way to sustain the operating electrical field is by increasing the thickness of the dielectric layer. However, existing silicon processing technology for high voltage or power applications (e.g., greater than 500 Volts) is incompatible with the dielectric thickness required for such applications (e.g., thickness greater than 0.7 microns).

Figure 1:
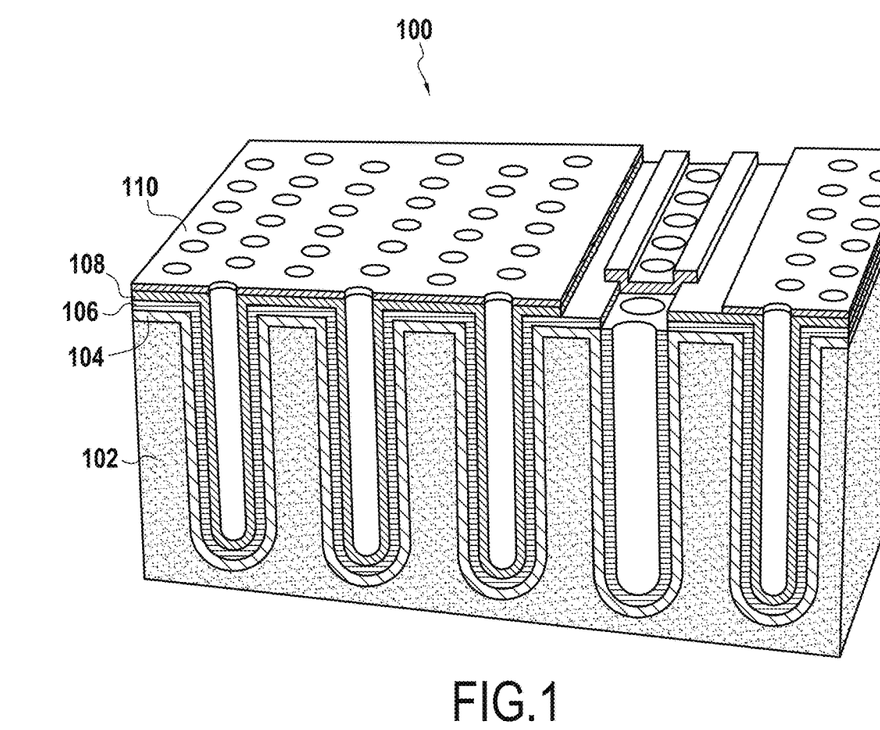
FIG. 1 is a perspective view of a conventional integrated capacitor.

For example, Gruenler et al. ("High-voltage monolithic 3D capacitors based on through-silicon-via technology, IEEE International Interconnect Technology Conference and IEEE Materials for Advanced Metallization Conference, 18-21 May 2015, Grenoble) proposes a 3D capacitor for high-voltage applications. An example 100 of Gruenler's capacitor is shown in FIG. 1. As shown, the capacitor 100 includes a substrate 102 having etched therein an array of cylindrical capillaries. The cylindrical capillaries are filled with a capacitive structure consisting of a semiconductor layer 104, a dielectric layer 106, a polysilicon layer 108, and a metal layer 110. The semiconductor layer 104 and the metal layer 110 provide a bottom electrode and a top electrode respectively for the capacitive structure.

Gruenler's 3D capacitor structure however is not well-suited for utilizing a large dielectric thickness (e.g., thickness greater than 0.7 microns). In one aspect, the 3D structure has a poor permeability to process gases, which complicates the processes for etching the cylindrical capillaries and depositing the capacitive stack. In another aspect, the structure suffers from a high level of mechanical stress once the cylindrical capillaries are filled by the capacitive stack. The high mechanical stress leads to substantial wafer warpage, complicating even further subsequent process steps. A thicker dielectric would exacerbate both deficiencies of Gruenler's structure, rendering capacitive integration even more complex. Moreover, it would significantly increase the probability of defects created or occurring in the dielectric coating (e.g., dielectric cracking or delamination), leading to random device breakdown.

European Patent Application EP 18305789.2 describes an improved 3D capacitor structure for high-voltage applications. The improved 3D capacitor structure has an open, protruding geometry which makes the structure more favorable to gas circulation during etching and improves its permeability to plasma. The protruding geometry also translates into reduced mechanical stress and wafer bow, which facilitates subsequent processing and reduces the probability of defects occurring within the structure. All of these advantages contribute toward the structure's compatibility with the use of a thicker dielectric (e.g., greater than 0.7 microns), and by consequence its better suitability for high-voltage applications (e.g., greater than 500 volts).

However, while the improved structure described in EP 18305789.2 reduces dielectric cracking and delamination from occurring within the 3D capacitor structure itself, cracks or delamination can still occur outside the 3D structure and can propagate into the 3D structure.

Figure 2:
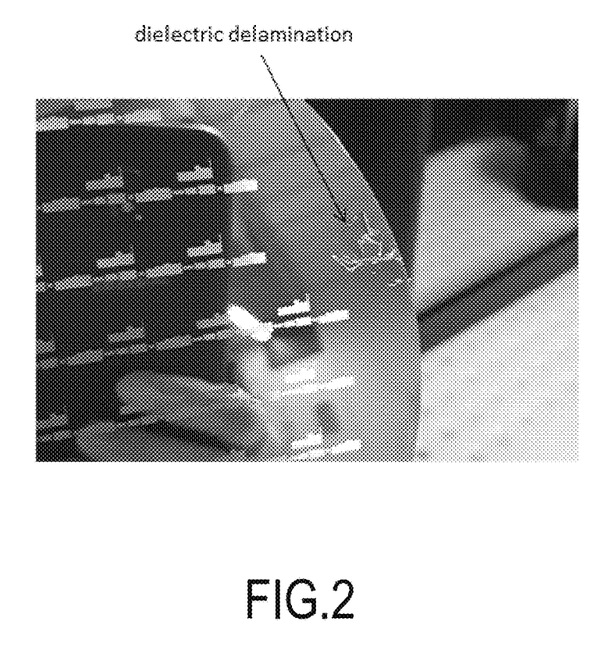
FIG. 2 shows an image of a silicon wafer suffering from dielectric delamination.

One source of such cracks is areas of the wafer having high mechanical stress. For example, it is typical in the fabrication of the above-described 3D capacitor structures to utilize full wafer deposition for the dielectric (which may be a single layer or a stack of layers). This results in the deposited dielectric covering not only the intended 3D structure but also large 2D (planar) areas of the wafer around the 3D structure. These 2D areas may ultimately be used to build circuit interconnections and/or planar functional circuits and/or may provide dicing lane regions. However, due to their large size and planarity, these 2D areas typically exhibit high mechanical stress, which is worsened by the use of a high thickness dielectric. As such, cracks and/or delamination can be observed in these areas as soon as the dielectric is deposited. For the purpose of illustration, FIG. 2 shows an image of a silicon wafer suffering from dielectric delamination in a 2D area of the wafer.

Figure 3:
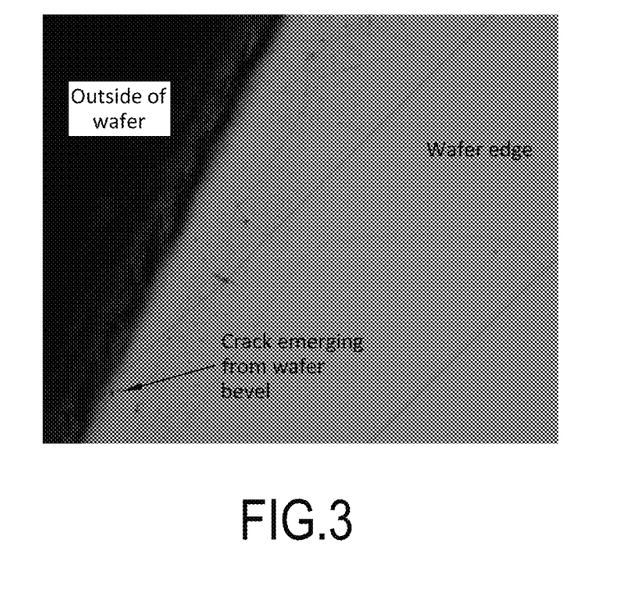
FIG. 3 shows a microscopic view of a crack emerging from a weak point located in the bevel region of a silicon wafer.

Another source of cracks is weak points in the wafer. Such weak points are typically present at the wafer edge and more particularly in the bevel region of the wafer edge (the bevel region is the curved/slanted portion of the wafer edge after edge grinding). For the purpose of illustration, FIG. 3 shows a microscopic view of a crack emerging after dielectric deposition from a weak point located in the bevel region of a silicon wafer. Several factors may cause weak points to appear in the wafer edge and the bevel region during processing, including the grinding of the wafer edge as well as lower deposition thickness control and different/non-uniform thermal conditions at the wafer edge (e.g., where the wafer is held inside the furnace by a quartz boat, the wafer edge may experience cold spots where the quartz boat touches the wafer). These factors are typically uncontrollable without substantive and expensive modifications of the employed process.

SUMMARY OF THE INVENTION

The present invention proposes a semiconductor structure, comprising:
a substrate;
a functional circuit structure disposed in an area of the substrate; and a first three-dimensional structure comprising at least one continuous trench that extends perpendicularly towards a base surface of the substrate and that surrounds the area of the substrate containing the functional circuit structure.

As such, the first three-dimensional structure protects the functional circuit structure from cracks occurring outside the area containing the functional circuit structure by preventing such cracks from propagating into the area containing the functional circuit structure. The cracks may be cracks in the top surface of the substrate. Alternatively or additionally, the cracks may occur in a layer (e.g., a dielectric layer) that is formed over the top surface of the substrate and into the continuous trench. Specifically, when a crack reaches the first three-dimensional structure, the crack is unable to change direction and follow the shape of the trench. Additionally, because the trench is continuous, the propagating crack cannot find any path that bridges the top surface of the substrate (or a layer laid over it) over the trench.

In addition, the three-dimensional structure reduces the probability of cracks occurring in 2D areas of the semiconductor structure. Specifically, when placed in a two-dimensional area of the substrate, the three-dimensional structure relaxes the macroscopic stress in the area.

In an embodiment, the substrate is a wafer having a useable die area and an exclusion area, and the area of the substrate containing the functional circuit structure corresponds to the useable die area of the wafer. The first continuous trench of the first three-dimensional structure may be located in the exclusion area of the wafer. This prevents cracks occurring in the exclusion area, and particularly the wafer bevel, from propagating into the useable die area.

In an embodiment, the area of the substrate containing the functional circuit structure comprises a matrix of unit chip areas, each unit chip area surrounded by a scribe region, and the functional circuit structure is disposed in a unit chip area of the unit chip areas. A second continuous trench of the first three-dimensional structure may be located in the respective scribe region of the unit chip area. As such, a protective seal ring may be provided per unit chip area, protecting the functional circuit structure from any cracks occurring outside the unit chip area.

In an embodiment, the respective scribe region of the unit chip area containing the functional circuit structure comprises a designated dicing lane region. The designated dicing lane region may be an area of the scribe region through which dicing lanes of the wafer are provided. The wafer may be diced along the dicing lanes in the designated dicing lane region to obtain in a single die containing the unit chip area.

In an embodiment, the second continuous trench of the first three-dimensional structure is located between the unit chip area and the designated dicing lane region of the respective scribe region. As such, the second continuous trench remains in the die containing the functional circuit structure after the wafer is diced.

Alternatively, the second continuous trench may be located inside the designated dicing lane region. As such, the second continuous trench may be eliminated from the die containing the functional circuit structure when the wafer is diced.

In either case, the second continuous trench protects the functional circuit structure during the process before wafer dicing (e.g., by stopping cracks from propagating into the functional circuit structure during processing). Further, when the second continuous trench is not eliminated by the wafer dicing, the trench protects the functional circuit structure during the dicing, specifically by preventing chipping due to dicing from extending into the functional circuit structure.

In an embodiment, the functional circuit structure comprises a second three-dimensional structure.

In an embodiment, the first three-dimensional structure or the second three-dimensional structure comprises a protruding structure that extends upwards from the base surface of the substrate.

In an embodiment, the protruding structure has a pattern. The pattern may comprise walls or pillars. The pillars may be of any shape (e.g., cylindrical, tripod-shaped, etc.).

In an embodiment, the first three-dimensional structure comprises a protruding structure, and the at least one continuous trench extends in between the walls or pillars of the protruding structure of the first three-dimensional structure.

In an embodiment, the pattern comprising walls comprises at least first and second wall regions. In an embodiment, walls of the first wall region are disposed along a first direction of the substrate and walls of the second wall region are disposed along a second direction of the substrate.

In an embodiment, a corner of the protruding structure (of the first and/or second three-dimensional structure) is rounded. The rounded corner may fall in a plane that is perpendicular or parallel to the base surface of the substrate.

In an embodiment, all corners of the protruding structure are rounded.

The rounding of corners drastically reduces both electrical stress and mechanical stress within the structure, rendering it better suited for use of a thicker dielectric layer and for high-voltage applications.

In an embodiment, the semiconductor structure comprises a layer stack disposed conformally over the protruding structure of the first three-dimensional structure and/or the second three-dimensional structure.

The layer stack may comprise a multi-layer device comprising one or more of: a metal-insulator-semiconductor (MIS) structure, a semiconductor-insulator-semiconductor (SIS) structure, or a metal-insulator-metal (MIM) structure.

In an embodiment, a corner of the protruding structure (of the first and/or second three-dimensional structure) is rounded, and a curvature radius of the rounded corner is greater than a thickness of an insulator layer of the layer stack. In an embodiment, the curvature radius of the rounded corner is greater than the double of a thickness of an insulator layer of the layer stack.

The first three-dimensional structure and the second three-dimensional structure may have same or different three-dimensional patterns.

In an embodiment, the first three-dimensional structure and the second three-dimensional structure may have the same three-dimensional pattern. This facilitates the process of fabricating the semiconductor by allowing the first and second three-dimensional structures to be created using common process steps.

In an embodiment, where the first three-dimensional structure and the second three-dimensional structure have the same three-dimensional pattern, the first three-dimensional structure has identical three-dimensional pattern critical dimensions as the second three-dimensional structure. This allows the first three-dimensional structure to be formed using the same process as the second three-dimensional structure.

In another embodiment, where the first three-dimensional structure and the second three-dimensional structure have the same three-dimensional pattern, the first three-dimensional structure has different three-dimensional pattern critical dimensions than the second three-dimensional structure. In an embodiment, the first three-dimensional structure has at least one larger three-dimensional pattern critical dimension than the second three-dimensional structure. In an embodiment, the at least one larger three-dimensional pattern critical dimension comprises a width separating elements of the three-dimensional pattern (of the first three-dimensional structure and the second three-dimensional structure).

The effect of having such width being larger in the first three-dimensional structure than in the second three-dimensional structure is that when a layer stack is deposited to fill the second three-dimensional structure, an empty space remains in the first three-dimensional structure. As such, the trench of the first three-dimensional structure remains continuous at the level of the top surface of the substrate. Accordingly, a crack occurring in the layer stack (e.g., at the edges of the substrate) would still be unable to find a path that bridges the top surface of the substrate over the continuous trench.

In an embodiment, the width separating adjacent elements of the three-dimensional pattern is made slightly larger in the first three-dimensional structure than in the second three-dimensional structure. This allows the two structures to have comparable dimensions, thereby causing no complications in further processing steps. Additionally, the holes in the top surface of the layer stack can be readily covered by a subsequent co-planarization layer.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

Embodiments of the present invention address the existing deficiencies of the prior art.

Figure 4:
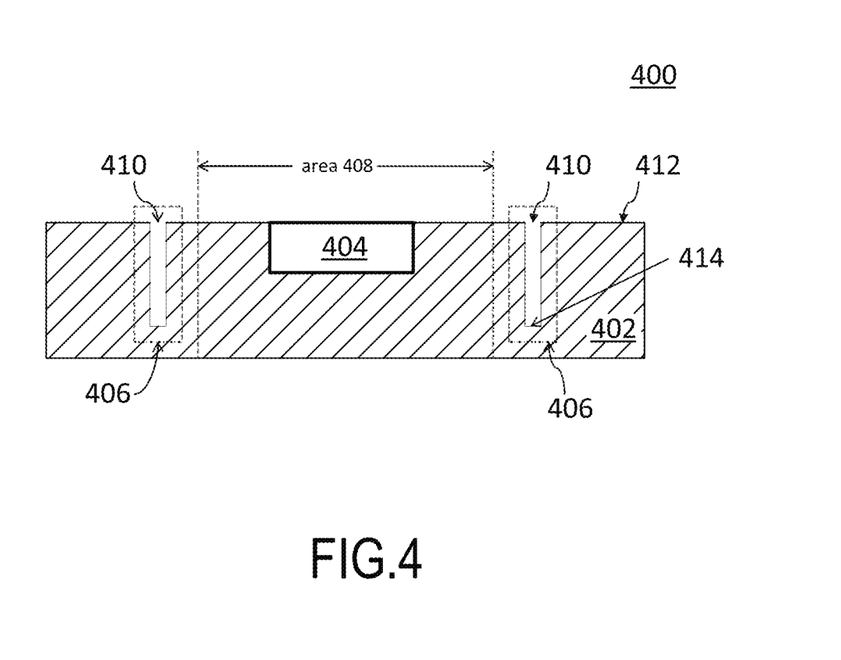
FIG. 4 illustrates a cross-section view of a semiconductor structure according to an embodiment of the present invention.

FIG. 4 illustrates a cross-section view of a semiconductor structure 400 according to an embodiment of the present invention. As shown in FIG. 4, semiconductor structure 400 includes a substrate 402, a functional circuit structure 404, and a three-dimensional structure 406. It is noted that the shown shapes/geometries of structures 404 and 406 are provided for the purpose of illustration only and not limitation. As would be understood by a person of skill in the art based on the teachings herein, structures 404 and 406 can include structures of various shapes/geometries according to embodiments.

The substrate 402 may be of any suitable substrate material. In an embodiment, the substrate 402 is made of silicon.

The functional circuit structure 404 is disposed in an area 408 of the substrate 402. The area 408 may be an area of the substrate 402 that is suitable for building circuitry therein. The area 408 may be defined at design time based on the substrate 402 and the intended fabrication process. The functional circuit structure 404 may include a two-dimensional (planar) or a three-dimensional (3D) semiconductor structure.

The three-dimensional structure 406 is located outside the area 408. In an embodiment, the three-dimensional structure 406 is located right outside the area 408.

In an embodiment, the three-dimensional structure 406 includes at least one trench such as trench 410. As shown in FIG. 4, trench 410 extends into the substrate 402 from a top surface 412 to a base surface 414 of the substrate 402. In an embodiment, trench 410 surrounds the area 408. Trench 410 may form any shape around the area 408 (e.g., a rectangle, a square, a circle, etc.).

In an embodiment, the trench 410 extends into the substrate 402 in a direction that is perpendicular to the top surface 412 of the substrate 402. However, in other embodiments, the trench 410 may extend at different angles (e.g., between 45 degrees and 135 degrees) relative to the top surface 412. As shown, where it extends into the substrate 402, the trench 410 creates one or more corners in the top surface 412 of the substrate 402. The corners may be sharp or rounded according to embodiments.

Figure 5:
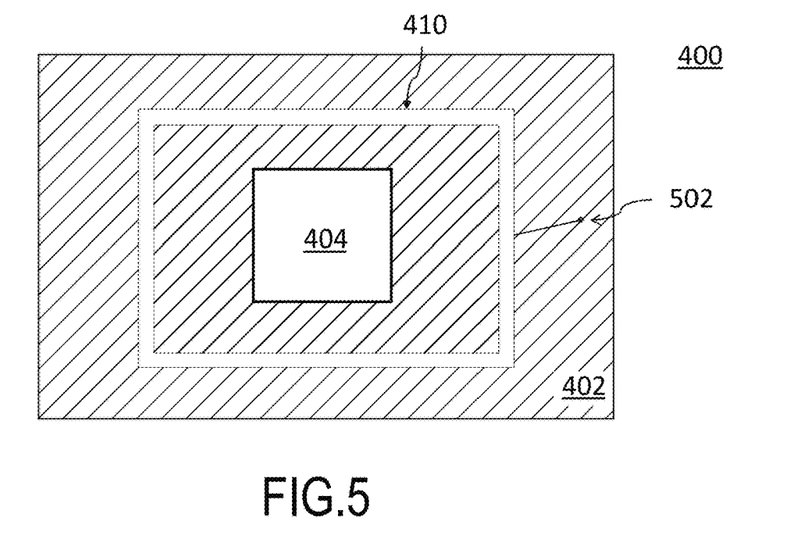
FIG. 5 illustrates a top view of a semiconductor structure according to an embodiment of the present invention.

In an embodiment, as shown in FIG. 5 which illustrates a top view of the semiconductor structure 400, the trench 410 is continuous. In other words, the trench 410 forms an uninterrupted empty space within the substrate 402.

As shown in FIG. 4, the uninterrupted empty space may extend from the top surface 412 to the base surface 414 of the substrate 402. In other embodiments, the uninterrupted empty space may not extend all the way down to the base surface 414 of the substrate 402. For example, one or more layers may be deposited into the trench 410 thereby covering the base surface 414 and filling a part of the bottom of the trench 410.

In an embodiment, the three-dimensional structure 406 protects the functional circuit structure 404 from cracks occurring outside the area 408 by preventing such cracks from propagating into the area 408. The cracks may be cracks in the top surface 412 of the substrate. Alternatively or additionally, the cracks may occur in a layer (e.g., a dielectric layer) that is formed over the top surface 412 of the substrate 402 and into the trench 410.

For example, as illustrated in FIG. 5, a crack 502 occurring outside the area 408 propagates towards the area 408. When the propagating crack 502 reaches the trench 410, its propagation is stopped because the crack is unable to change direction and follow the shape of the trench 410. Additionally, when the trench 410 is continuous, the propagating crack 502 cannot find any path that bridges the top surface 412 of the substrate 402 (or a layer laid over it) over the trench 410.

In addition, the three-dimensional structure 406 reduces the probability of cracks occurring in 2D areas of the semiconductor structure 400. Specifically, when placed in a 2D area of the substrate 402, the three-dimensional structure 406 relaxes the macroscopic stress in the area.

Figure 6:
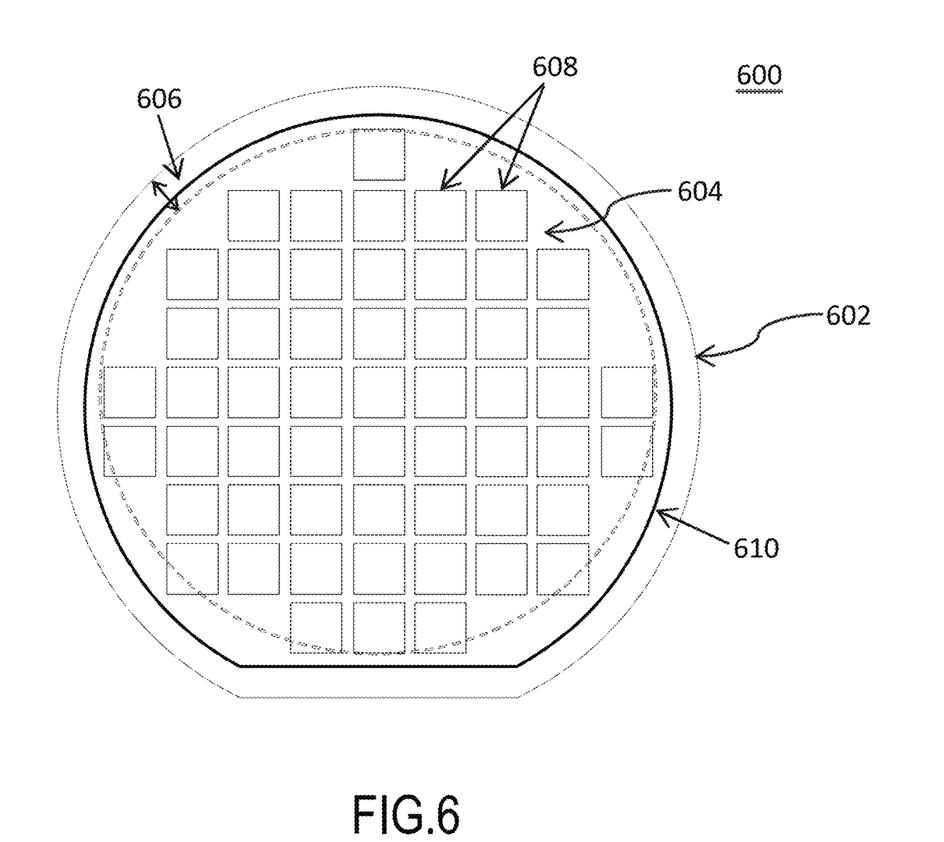
FIG. 6 illustrates a top view of a semiconductor structure according to an embodiment.

In an embodiment, as shown in FIG. 6, the semiconductor structure 400 may be a wafer-level structure 600. As such, the substrate 402 may be a wafer 602. The wafer 602 has a useable die area 604 and an exclusion area 606.

The area 408 containing the functional circuit structure 404 may correspond to the useable die area 604 of the wafer 602. The useable die area 604 may include a matrix of unit chip areas 608. The functional circuit structure 404 may be located in one or more of the unit chip areas 608 of the useable die area 604. In an embodiment, the one or more unit chip areas containing the functional circuit structure 404 are located entirely inside the useable die area 604.

The at least one trench of the three-dimensional structure 406 may include a first continuous trench 610. The first continuous trench 610 surrounds the useable die area 604. In an embodiment, the first continuous trench 610 is located in the exclusion area 606 of the wafer 602. In another embodiment, the first continuous trench 610 is located right inside the exclusion area 606, i.e., as close as possible to the useable die area 604.

Figure 7:
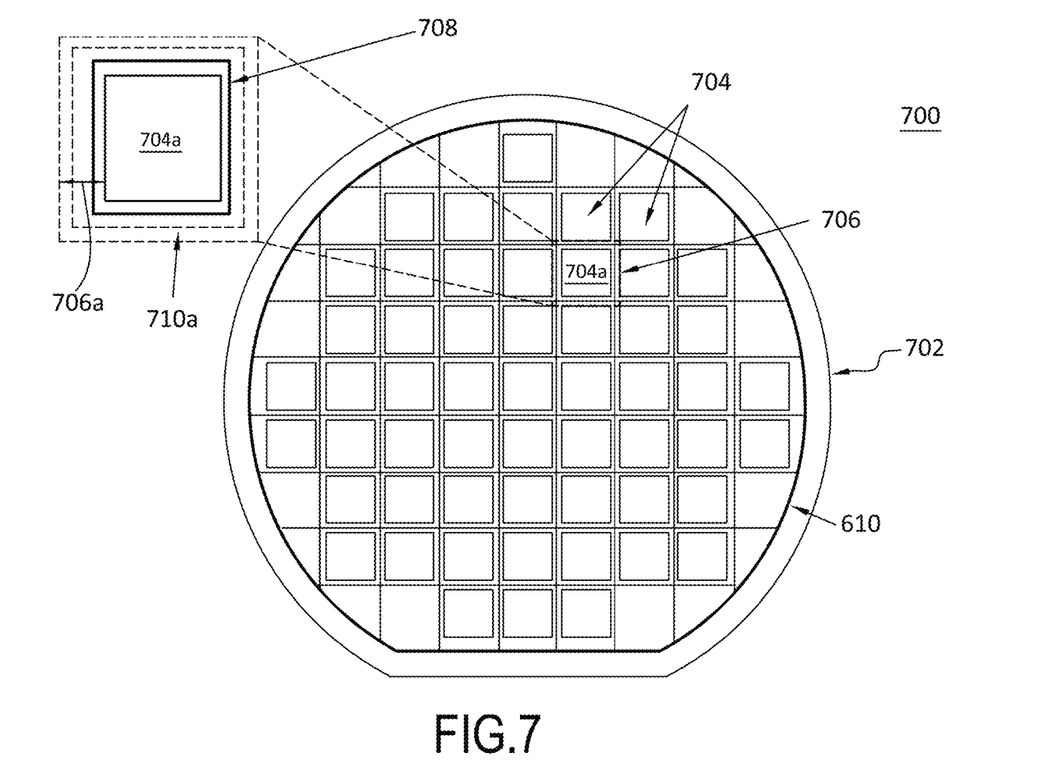
FIG. 7 illustrates a top view of a semiconductor structure according to an embodiment.

In another embodiment, as shown in FIG. 7, the semiconductor structure 400 may be a wafer-level structure 700. As such, the substrate 402 may be a wafer 702.

The area 408 containing the functional circuit structure 404 may comprise a matrix of unit chip areas 704, each unit chip area surrounded by a respective scribe region 706.

The functional circuit structure 404 may be disposed in a unit chip area 704a of the unit chip areas 704.

The at least one trench of the three-dimensional structure 406 may include a second continuous trench 708. The second continuous trench 708 surrounds the unit chip area 704a. In an embodiment, the second continuous trench 708 is located in the respective scribe region 706a of the unit chip area 704a.

In an embodiment, the respective scribe region 706a of the unit chip area 704a comprises a designated dicing lane region 710a. The designated dicing lane region 710a may be an area of the scribe region 706a through which dicing lanes of the wafer 702 are provided. The wafer 702 may be diced along the dicing lanes in the designated dicing lane region 710a to obtain in a single die containing the unit chip area 704a.

In an embodiment, the second continuous trench 708 is located between the unit chip area 704a and the designated dicing lane region 710a of the respective scribe region 706a. As such, the second continuous trench 708 remains in the die containing the unit chip area 704a (and the functional circuit structure 404) after the wafer 702 is diced.

Alternatively, the second continuous trench 708 may be located inside the designated dicing lane region 710a. As such, the second continuous trench 708 may be eliminated from the die containing the unit chip area 704a (and the functional circuit structure 404) when the wafer 702 is diced.

The second continuous trench 708 protects the functional circuit structure 404 during the process before wafer dicing (e.g., by stopping cracks from propagating into the functional circuit structure 404 during processing). Further, when the trench 708 is not eliminated by the wafer dicing, the trench 708 protects the functional circuit structure 404 during the dicing, specifically by preventing chipping due to dicing from extending into the functional circuit structure 404.

As would be understood by a person of skill in the art based on the teachings herein, in embodiments, the three-dimensional structure 406 may include one or more trenches such as trench 610 and/or one or more trenches such as trench 708. For example, in the embodiment of FIG. 7, there is provided a trench 610 that surrounds the useable die area of the wafer 702 and a plurality of trenches 708 each surrounding a respective unit chip area 704. Adjacent trenches 708 may overlap with one another by sharing a common edge and/or corner.

In other embodiments, the three-dimensional structure 406 may include trenches that surround a group of unit chip areas 704. The group of unit chip areas 704 may include any number of unit chip areas (e.g., 2, 4, 6, 9, 16, etc.). This may be provided instead of, or in addition to, enclosing individual unit chip areas with respective trenches.

In an embodiment, the three-dimensional structure 406 may be configured in accordance with a desired maximum 3D structure density (percentage of total wafer area occupied by 3D structures) of the wafer 702. Typically, the addition of 3D structures increases strain in the wafer. Above a certain 3D density (e.g., 20%), wafer bow begins to build in the wafer, which complicates further process steps (e.g., clamping, handling, etc.). As such, the total area of the three-dimensional structure 406 may be selected so as not to exceed the desired maximum 3D structure density of the wafer.

Additionally, the trenches of the three-dimensional structure 406 may be distributed uniformly over the wafer 702 to ensure a uniform 3D structure density over the wafer. This ensures that no excessive bow occurs in areas of the wafer having very dense 3D structures.

The three-dimensional structure 406 may include 3D structures of different shapes. In an embodiment, some or all of the 3D structures forming the three-dimensional structure 406 include continuous trenches as described above. Further, some or all of the 3D structures forming the three-dimensional structure 406 may include respective protruding structures. The protruding structures extend upwards from the base surface 414 of the substrate 402 and may correspond to a pattern. The (continuous) trench of the 3D structure may extend in between the protruding structure.

Figure 8:
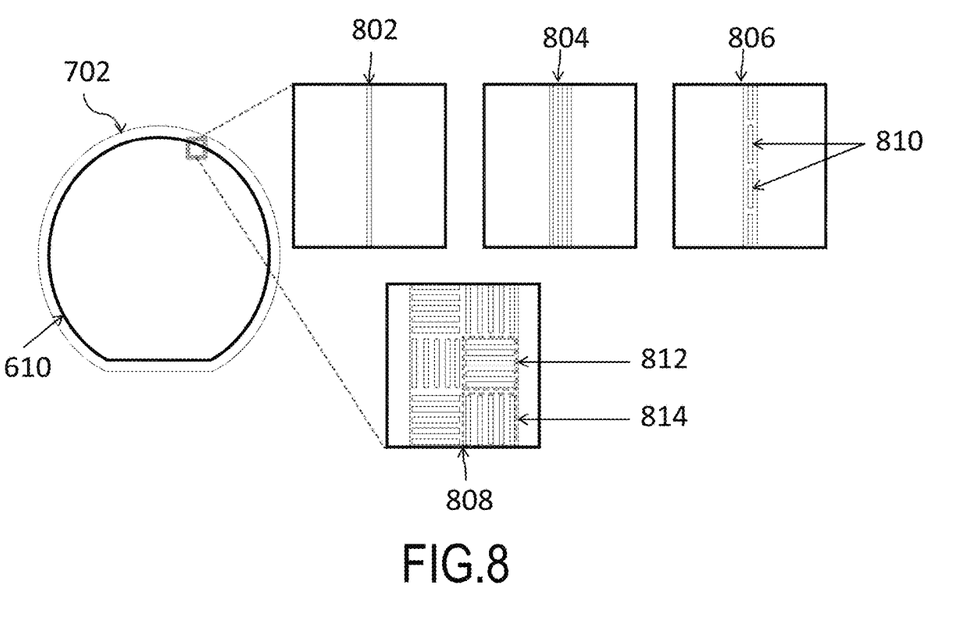
FIG. 8 illustrates top views of semiconductor structures according to an embodiment.

For the purpose of illustration, FIG. 8 shows top views of various 3D structures 802, 804, 806, and 808 which may be part of the three-dimensional structure 406. Specifically, FIG. 8 illustrates that the first continuous trench 610 described above may be provided by any one of the 3D structures 802, 804, 806, and 808. It is noted that the white color regions in 3D structures 802, 804, 806, and 808 correspond to the trench(es) of the structure. As would be understood by a person of skill in the art, other trenches, such as the trenches 708, may also be provided by any one of the 3D structures 802, 804, 806, and 808.

As shown, the 3D structure 802 is a single continuous trench. The 3D structure 804 is a multi-trench structure, i.e., it includes multiple discrete continuous trenches in parallel to one another. The 3D structure 806 includes a continuous trench and a protruding structure of discontinuous (limited length) walls 810 disposed inline within the continuous trench.

The 3D structure 808 includes a continuous trench and a protruding structure of limited length walls disposed in different directions. The continuous trench extends in between the walls of the protruding structure. In an embodiment, the walls form a pattern of a plurality of wall regions, such as first and second wall regions 812 and 814. Each wall region 812, 814 comprises multiple parallel walls having limited lengths. In an embodiment, the walls forming a wall region may be disposed along either a first direction or a second direction of the substrate. For example, in the structure 808, the walls of the first wall region 812 are disposed along a first direction, and the walls of the second wall region 814 are disposed along a second direction. In other embodiments, more than two directions may be used.

The first direction and the second direction may form a defined angle with each other. The defined angle may be selected to reduce mechanical stress within the structure. In an embodiment, the first direction may be perpendicular to the second direction. However, embodiments are not limited to this implementation and other angle relationships (e.g., 10, 20, 30, 40, 60, and 120 degrees) between the first direction and the second direction may be used.

In an embodiment, wall regions disposed along the first direction and wall regions disposed along the second direction are disposed symmetrically to reduce mechanical stress along the first direction and the second direction. In an embodiment, a wall region disposed along the first direction is surrounded along its sides by walls regions disposed along the second direction, and vice versa.

Figure 9:
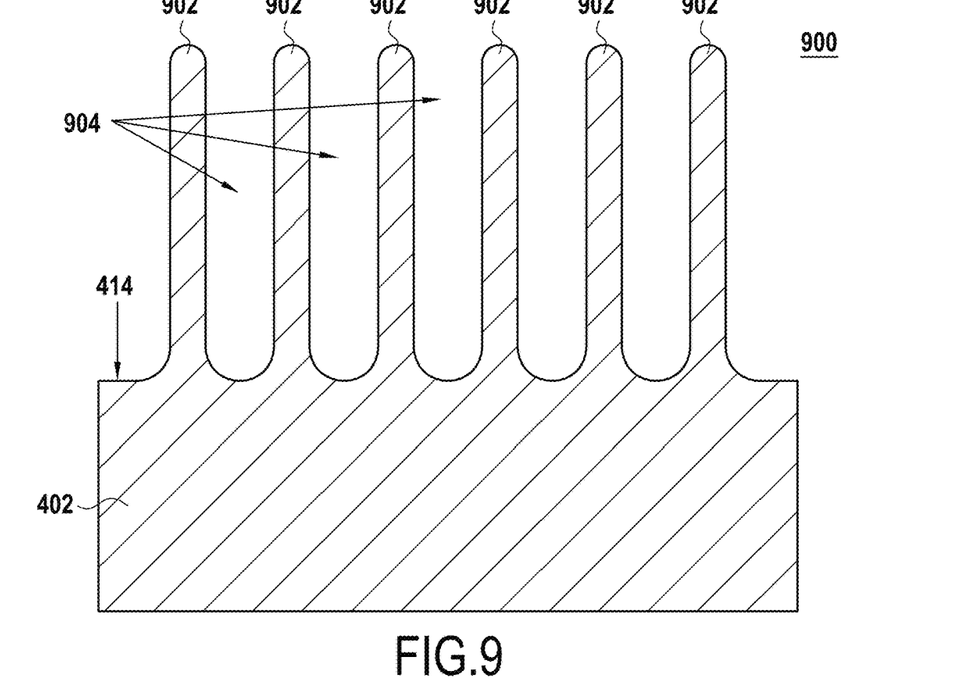
FIG. 9 is a cross-section view of a semiconductor structure according to an embodiment.

According to another embodiment, the three-dimensional structure 406 may include a 3D structure as illustrated in FIG. 9. As shown, the 3D structure includes a protruding structure formed of pillars 902 that extend upwards from the base surface 414 of the substrate 402. A continuous trench 904 extends in between the pillars 902 of the protruding structure. The pillars 902 may be cylindrical or tripod-shaped as described in U.S. Pat. No. 8,283,750.

Figure 10:
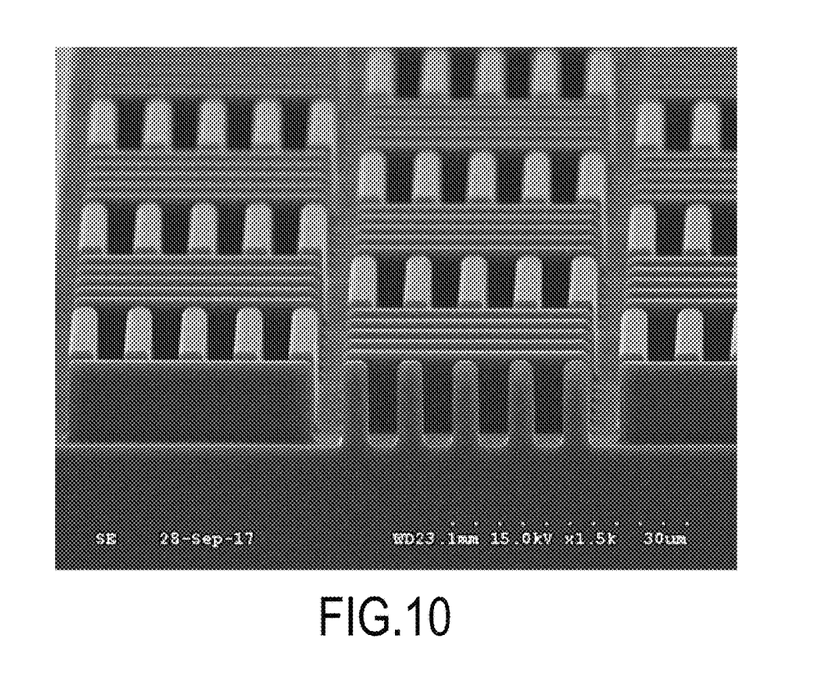
FIG. 10 is a scanning electron microscopy (SEM) image of a 3D structure according to an embodiment of the present invention.

In an embodiment, where the 3D structure forming the three-dimensional structure 406 includes a protruding structure, a corner of the protruding structure may be rounded during processing. The rounded corner may fall in a plane that is perpendicular or parallel to the base surface 414 of the substrate 402. In an embodiment, all corners of the protruding structure may be rounded. For the purpose of illustration, FIG. 10 is an SEM image of the 3D structure 808 described above according to an embodiment. As shown, according to this embodiment, all corners of the protruding structure of the 3D structure 808 are rounded. The rounding of corners drastically reduces both electrical stress and mechanical stress within the structure, rendering it better suited for use of a thicker dielectric layer and for high-voltage applications.

According to embodiments, the functional circuit structure 404 may include two-dimensional (planar) and/or three-dimensional structures.

Figure 11:
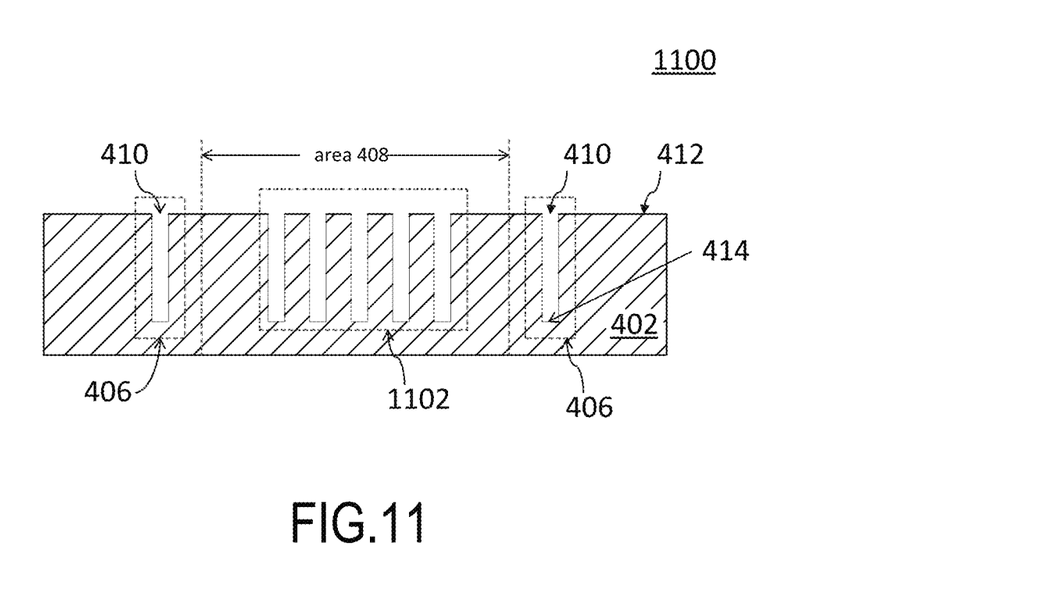
FIG. 11 illustrates a cross-section view of a semiconductor structure according to an embodiment of the present invention.

In an embodiment, as shown in FIG. 11, the functional circuit structure 404 includes a three-dimensional structure 1102. It is noted that the shown shape of the three-dimensional structure 1102 in FIG. 11 is provided for the purpose of illustration only and not limitation. As would be understood by a person of skill in the art based on the teachings herein, the three-dimensional structure 1102 may take a variety of 3D shapes according to embodiments, including for example the shapes of 3D structures 802, 804, 806, and 808 described above.

In an embodiment, the three-dimensional structure 1102 comprises a protruding structure that extends upwards from the base surface 414 of the substrate 402. The protruding structure may have a pattern of walls (e.g., such as 3D structures 806 and 808) or pillars (e.g., 3D structure 900). Thus, in accordance with embodiments, the three-dimensional structure 406 and/or the three-dimensional structure 1102 can include a protruding structure.

In an embodiment, the three-dimensional structure 406 may have an identical three-dimensional pattern as the three-dimensional structure 1102. An identical pattern corresponds to the case where the structures 406 and 1102 have a 3D building block of the same type. For example, both structures 406 and 1102 may have the three-dimensional pattern provided by the 3D building block formed by the first and second wall regions 812 and 814 of the 3D structure 808. However, while having an identical pattern, the three-dimensional structures 406 and 1102 may have identical or different three-dimensional pattern critical dimensions critical dimensions, more particularly same or different 3D building block critical dimensions. Referring again to the 3D structure 808, having identical three-dimensional pattern critical dimensions means that the first and second wall regions 812 and 814 are geometrically identical (within processing margins of error) for both three-dimensional structures 406 and 1102. In other words, the first and second wall regions 812 and 814 have the exact same dimensions, e.g., wall thickness, wall height, wall length, inter-wall spacing, etc.

In an embodiment, the three-dimensional structures 406 and 1102 may have the same three-dimensional pattern but different three-dimensional pattern critical dimensions. Specifically, the three-dimensional structure 406 may have at least one three-dimensional pattern critical dimension that is larger than the three-dimensional structure 1102.

In an embodiment, the at least one larger critical dimension comprises a width separating adjacent elements (e.g., walls or pillars) of the three-dimensional pattern. For example, referring to the 3D structure 808, the width separating any two adjacent parallel walls (in the first and second wall regions 812 and 814) may be larger in three-dimensional structure 406 than in three-dimensional structure 1102.

Figure 12:
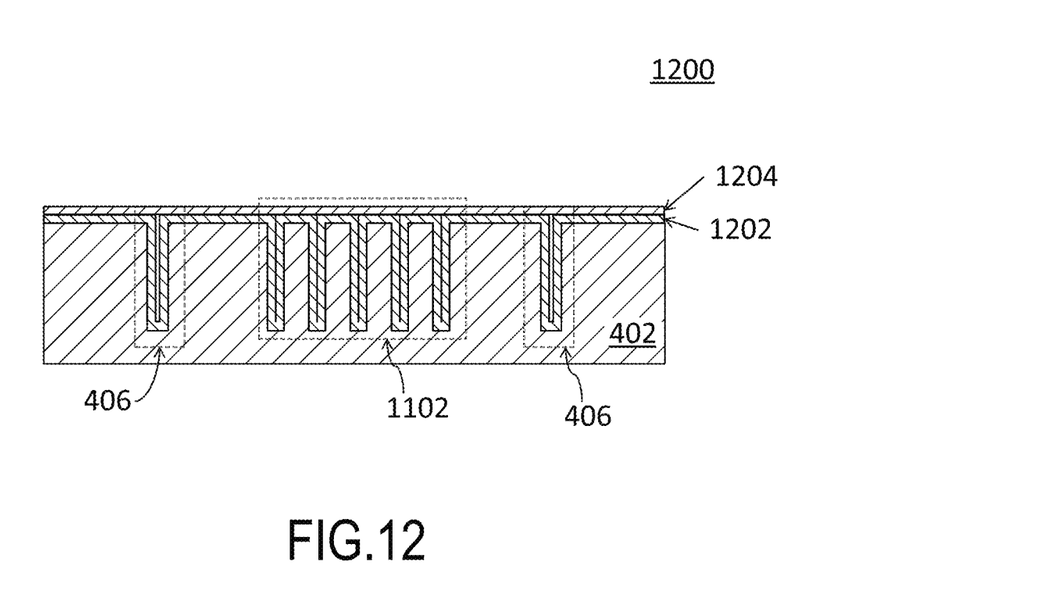
FIG. 12 is a cross-section view of a semiconductor structure according to an embodiment.

The effect of having such width being larger in structure 406 than in structure 1102 is illustrated in FIG. 12, which shows a cross-section view of an example structure 1200 according to an embodiment. As shown in FIG. 12, in structure 1200, the three-dimensional structure 406 includes a continuous trench. The structure 1102 may be, for example, a multi-trench structure such as structure 804 or a structure with a continuous trench such as structure 808 or structure 900. The width of the continuous trench of the three-dimensional structure 406 is larger than the width of the trenches formed in structure 1102. Accordingly, when a layer stack (one or more layers) 1202 is deposited on the substrate 402 and into the structures 406 and 1102 (the layer stack 1202 designed to closely fill the structure 1102), an empty space remains in the structure 406. As such, the trench of the structure 406 remains continuous at the level of the top surface 412 of the substrate 402. Accordingly, a crack occurring in the layer stack 1202 (at the edges of the substrate 402) would still be unable to find a path that bridges the top surface 412 of the substrate 402 over the continuous trench.

In an embodiment, the width separating adjacent elements of the three-dimensional pattern is made slightly larger in the three-dimensional structure 406 than in three-dimensional structure 1102. For example, referring to FIG. 12, the trench of the structure 406 may be designed to be 100-200 nanometers wider than the trenches of structure 1102 where those trenches range from 2-6 microns. This allows the two structures 406 and 1102 to have comparable dimensions, thereby causing no complications in further processing steps. Additionally, the holes in the top surface of the layer stack 1202 can be readily covered by a subsequent co-planarization layer 1204.

As described above, in an embodiment, the three-dimensional structure 406 and/or the three-dimensional structure 1102 can include a protruding structure. In an embodiment, a layer stack may be disposed conformally over the protruding structure of the first three-dimensional structure 406 and/or of the second three-dimensional structure 1102. The layer stack may comprise a multi-layer device comprising one or more of: a metal-insulator-semiconductor (MIS) structure, a semiconductor-insulator-semiconductor (SIS) structure, or a metal-insulator-metal (MIM) structure. In an embodiment, as described above, a corner of the protruding structure may be rounded. In a particular embodiment, a curvature radius of the rounded corner is configured to be greater than a thickness of an insulator layer of the layer stack. In another embodiment, the curvature radius of the rounded corner is configured to be greater than the double of the thickness of the insulator layer of the layer stack.

Figure 13:
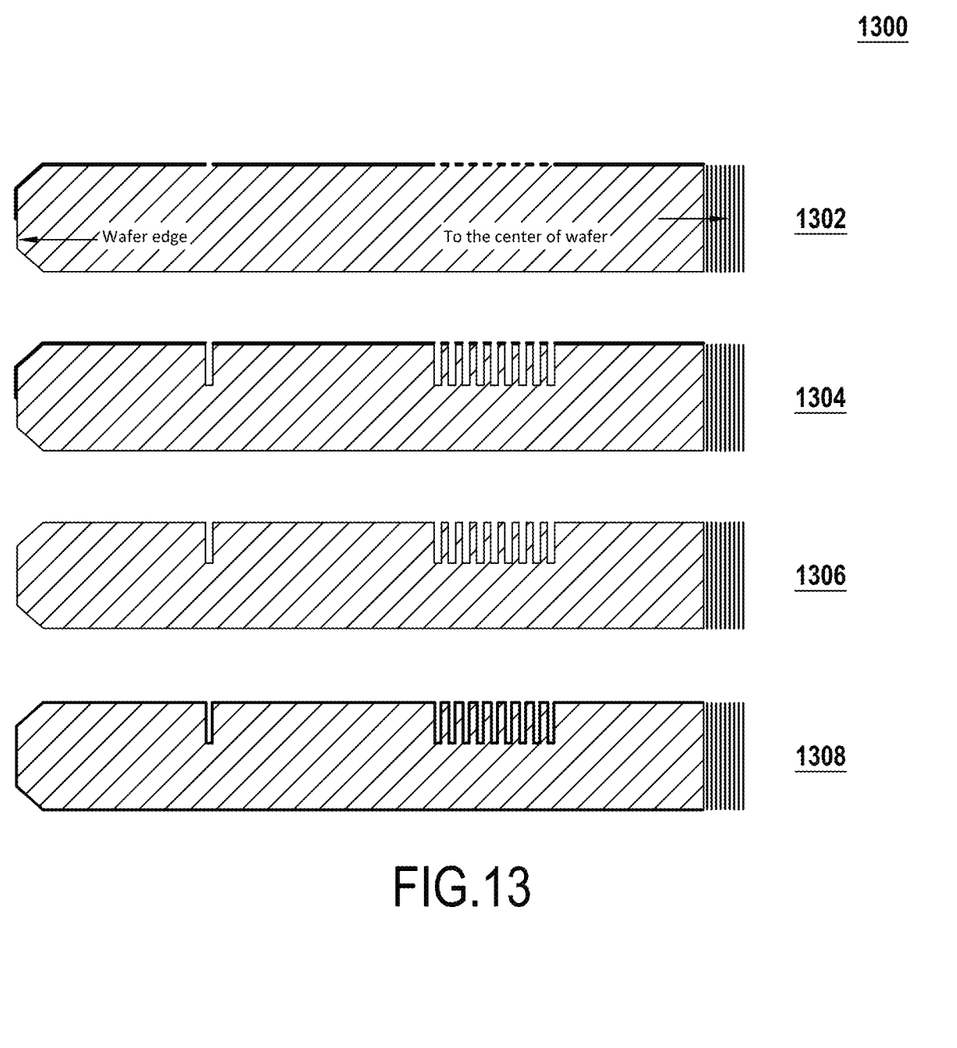
FIG. 13 illustrates an example process that may be used in an example embodiment.

To fabricate semiconductor structures according to the present invention, various approaches can be envisaged. In an embodiment, the three-dimensional structure 406 may be created using the same process designed to produce the functional circuit structure 404. For the purpose of illustration, FIG. 13 illustrates an example process 300 that may be used in an example embodiment. In this example, the functional circuit structure 404 is designed to be created in a designated circuit area of a silicon wafer. The three-dimensional structure 406 is designed to be created closer to the edge of the wafer, for example in the exclusion area of the wafer.

As shown, the process 1300 begins in step 1302, which includes applying a mask pattern to define the ultimate locations of the functional circuit structure 404 and the three-dimensional structure 406. Then, in step 1304, silicon deep etching (DRIE) is applied to produce the three-dimensional structures corresponding to structures 404 and 406. Subsequently, in step 1306, the mask is removed. Finally, in step 1308, a full wafer deposition of at least one layer is performed.

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A semiconductor structure, comprising:
a substrate;
a functional circuit structure disposed in an area of the substrate; and
a first three-dimensional structure comprising at least one continuous trench that forms an uninterrupted empty space within the substrate and that extends into the substrate from a top surface of the substrate towards an upper surface of the bottom portion of the substrate and that surrounds the area of the substrate containing the functional circuit structure,
wherein the functional circuit structure comprises a second three-dimensional structure, and
wherein the first three-dimensional structure and the second three-dimensional structure each comprises a protruding structure, the protruding structure extending upwards from the upper surface of the bottom portion of the substrate and having a pattern comprising a plurality of pillars or a plurality of discontinuous walls, and
wherein the first three-dimensional structure and the second three-dimensional structure have a same three-dimensional pattern, but the first three-dimensional structure has at least one larger three-dimensional pattern critical dimension than the second three-dimensional structure.

2. The semiconductor structure of claim 1, wherein the substrate is a wafer having a useable die area and an exclusion area, and wherein the area of the substrate containing the functional circuit structure corresponds to the useable die area of the wafer.

3. The semiconductor structure of claim 2, wherein the at least one continuous trench of the first three-dimensional structure includes a continuous trench which is located in the exclusion area of the wafer.

4. The semiconductor structure of claim 1, wherein the area of the substrate containing the functional circuit structure comprises a matrix of unit chip areas, each unit chip area surrounded by a respective scribe region, wherein the functional circuit structure is disposed in a unit chip area of the unit chip areas, and wherein the at least one continuous trench of the first three-dimensional structure includes a second continuous trench which is located in the respective scribe region of the unit chip area.

5. The semiconductor structure of claim 4, wherein the second continuous trench of the first three-dimensional structure is located between the unit chip area and a designated dicing lane region of the respective scribe region.

6. The semiconductor structure of claim 1, wherein all corners of the protruding structure are rounded.

7. The semiconductor structure of claim 1, comprising a layer stack disposed conformally over the protruding structure of the first three-dimensional structure or the second three-dimensional structure.

8. The semiconductor structure of claim 7, wherein a corner of the protruding structure is rounded, and wherein a curvature radius of the rounded corner is greater than a double of a thickness of an insulator layer of the layer stack.

9. The semiconductor structure of claim 1, wherein the at least one larger three-dimensional pattern critical dimension comprises a width separating adjacent elements of the three-dimensional pattern.

10. The semiconductor structure of claim 9, comprising a layer stack disposed conformally over the protruding structure of the first three-dimensional structure and the second three-dimensional structure, said layer stack filling the second three-dimensional structure but leaving an empty space in the first three-dimensional structure.

* * * * *